(12) United States Patent
Fukumi et al.

(10) Patent No.: US 6,294,399 B1
(45) Date of Patent: Sep. 25, 2001

(54) QUANTUM THIN LINE PRODUCING METHOD AND SEMICONDUCTOR DEVICE

(75) Inventors: Masayuki Fukumi, Tenri; Yasumori Fukushima, Sakurai, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/492,329

(22) Filed: Jan. 27, 2000

(30) Foreign Application Priority Data

Jan. 29, 1999 (JP) .................................................. 11-021520

(51) Int. Cl.[7] ............................................... H01L 21/00
(52) U.S. Cl. ...................................... 438/22; 257/14
(58) Field of Search ............................ 438/201, 211, 438/257–263, 590, 593, 962, 481; 257/14, 20, 24

(56) References Cited

U.S. PATENT DOCUMENTS 5,296,719 * 3/1994 Hirai et al. .......................... 257/14
6,064,145 * 5/2000 Lee ..................................... 313/309

FOREIGN PATENT DOCUMENTS 5-29613   2/1993 (JP) .
5-29632   2/1993 (JP) .
5-55141   3/1993 (JP) .

* cited by examiner

*Primary Examiner*—David Nelms
*Assistant Examiner*—David Vu
(74) *Attorney, Agent, or Firm*—Nixon & Vanderhye, P.C.

(57) ABSTRACT

A Si protruding portion is formed on a Si substrate by opportunely using the general film forming technique, photolithographic technique and etching technique. A second oxide film is formed to fill up a space between Si protruding portions, and the surface is flattened by the CMP method or the like. Then, the second oxide film is subjected to anisotropic etching to form a Si exposed portion at the top of the Si protruding portion. A Si thin line is made to grow in this Si exposed portion, and then a third oxide film for isolating the Si thin line from the Si substrate is formed through oxidation. A quantum thin line is thus formed at low cost without using any special technique of SOI or the like. Furthermore, the substrate surface is flattened, allowing the formation of a single electron device or a quantum effect device to be easy. The quantum thin line is isolated from the Si substrate by the third oxide film, completely confining the electron. With this arrangement, a quantum thin line that has good substrate surface flatness and is able to form a complete electron confining region is formed by using a semiconductor substrate of a Si substrate or the like.

20 Claims, 10 Drawing Sheets

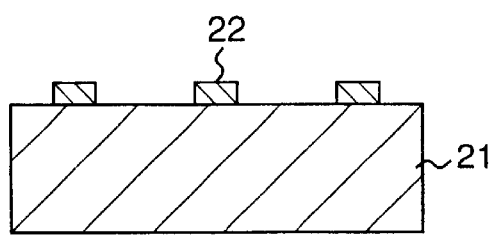
Fig.11A PRIOR ART
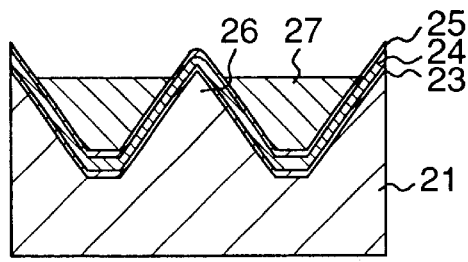
Fig.11D PRIOR ART
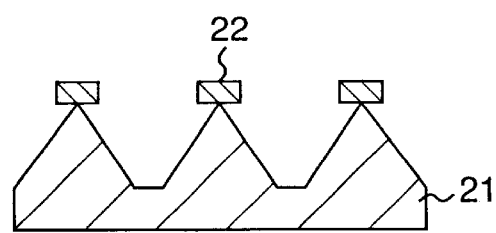
Fig.11B PRIOR ART
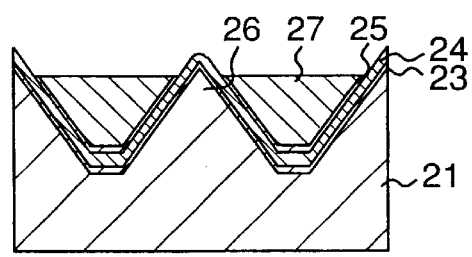
Fig.11E PRIOR ART
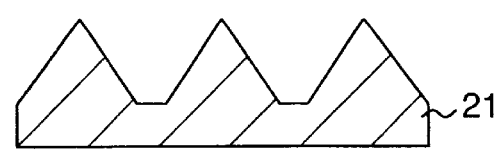
Fig.11C PRIOR ART
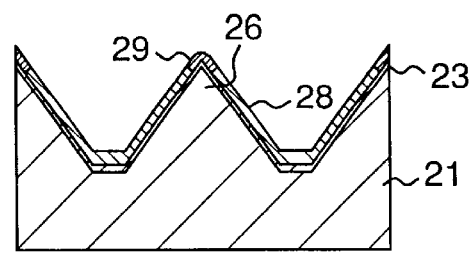
Fig.11F PRIOR ART
Fig.11G PRIOR ART
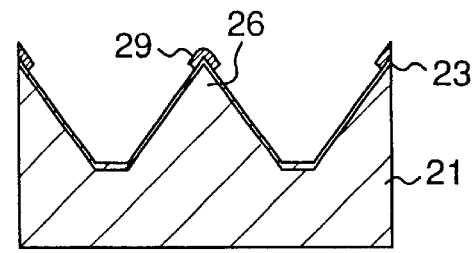

US 6,294,399 B1

QUANTUM THIN LINE PRODUCING METHOD AND SEMICONDUCTOR DEVICE

BACKGROUND OF THE INVENTION

The present invention relates to a quantum thin line producing method for forming a quantum thin line constructed of a metal or semiconductor that is minute enough to cause a quantum size effect on an insulating substrate or a semiconductor substrate via an insulating layer and to a semiconductor device employing this quantum thin line.

The large-scale integrated circuits (LSIs) that have supported the development of electronics and currently become the industrial nucleus have made great strides in terms of their performances toward larger capacity, higher speed, lower consumption of power and so on through the microstructural progress thereof. However, it is considered that the conventional device reaches the limit in terms of the principle of operation when the device size becomes 0.1 μm or smaller, and accordingly, there are conducted energetic researches on a new device based on a new principle of operation. As for this new device, there is a device having a microstructure called the nanometer-size quantum dot or quantum thin line. The nanometer-size quantum dot is energetically examined together with a variety of quantum effect devices, particularly for the application thereof to a single electron device utilizing the Coulomb blockade phenomenon. The nanometer-size quantum thin line is expected to be applied to a super-high-speed transistor utilizing the quantum effect.

Particularly, in regard to the nanometer-size quantum thin line, there is carried out trial production of a semiconductor quantum device based on a new principle of operation that the degree of freedom of an electron is limited by confining the electron in a semiconductor layer having a width approximately equal to that of the electron wavelength (de Broglie wavelength) in a semiconductor crystal and by utilizing a quantization phenomenon caused by this. That is, the wavelength of an electron in a semiconductor layer is about 10 nm. Therefore, it is theoretically derived that, if the channel width is about the wavelength (width: 10 nm) of an electron, then the electron can move in this thin line while being scarcely deviated, for the achievement of the increased mobility of the electron.

Therefore, by forming a conductive layer in which a number of quantum thin lines as described above are arranged in a plane and controlling the number of electrons inside this conductive layer by the operation of a gate electrode, there can be produced a quantum thin line transistor having a higher operating speed than the conventional transistor. By incorporating a number of quantum thin lines as described above into a laser light emitting layer, there can be obtained a high-efficiency semiconductor laser device that has a sharp spectrum and excellent high-frequency characteristics even with a small injection current.

Conventionally, as a method for forming the aforementioned quantum thin line, there have been proposed methods as disclosed in the following reference documents (1) through (3).

(1) Japanese Patent Laid-Open Publication No. HEI 5-55141.

FIGS. 9A through 9E are process charts showing the "Method for producing Si thin line on SOI (silicon-on insulator) substrate utilizing anisotropic etching" disclosed in the above reference document (1).

Referring to FIGS. 9A through 9E, first, as shown in FIG. 9A, a mask material layer 4 is deposited on a (100)-SOI substrate constructed of a silicon substrate 1, an insulating film 2 and a crystal silicon layer 3 as shown in FIG. 9B, and thereafter a stripe-shaped window is formed in a region where a quantum thin line is to be subsequently formed.

Next, as shown in FIG. 9C, the crystal silicon layer 3 is removed by anisotropic etching while exposing the (111) plane by means of KOH or the like. Subsequently, as shown in FIG. 9D, the mask material layer 4 is removed. Finally, by performing anisotropic etching again by means of KOH or the like as shown in FIG. 9E, a quantum thin line 5 comprised of a triangular prism whose two planes are (111) planes is formed, since the etching rate of the (111) plane is slow relative to the fast etching rate of the (100) plane.

(2) Japanese Patent Laid-Open Publication No. HEI 5-29632.

FIGS. 10A through 10F are process charts showing the "Method for producing Si thin line on Si substrate utilizing anisotropic etching" disclosed in the above reference document (2).

Referring to FIGS. 10A through 10F, first, as shown in FIG. 10A, an etching mask 12 is formed of an silicon oxide film or a silicon nitride film on a silicon (100)-substrate 11. Next, as shown in FIG. 10B, the silicon (100)-substrate 11 is etched by using a silicon anisotropic etchant to form a projecting portion having a triangular cross-section shape.

Next, as shown in FIG. 10C, the etching mask 12 is removed, and after the formation of a silicon nitride film 13, a resist pattern 14 is formed so as to cover the top of the projecting portion. Then, as shown in FIG. 10D, the silicon nitride film 13 and the silicon (100)-substrate 11 are etched by using the resist pattern 14 as a mask.

Next, as shown in FIG. 10E, the resist pattern 14 is removed, and thereafter the silicon (100)-substrate 11 is oxidized. In this case, the silicon nitride film 13 serves as an oxidation-resistant mask, and therefore, a non-oxidized region 15 is left at and around the top of the projecting portion. Finally, as shown in FIG. 10F, if the silicon nitride film 13 is removed, then a silicon thin line (the above-mentioned region) 15 that is insulated and isolated from the silicon (100)-substrate 11 is formed at the top of the projecting portion.

(3) Japanese Patent Laid-Open Publication No. HEI 5-29613.

FIGS. 11A through 11G are process charts showing the "Method for producing Si thin line device during forming gate electrode on Si ridge portion through titanium silicification" disclosed in the above reference document (3).

Referring to FIGS. 11A through 11G, first, as shown in FIG. 11A, a silicon oxide film pattern 22 is formed on a silicon substrate 21. Subsequently, as shown in FIG. 11B, a projecting portion having a triangular cross-section shape is formed by silicon anisotropic etching. Thereafter, as shown in FIG. 1C, the silicon oxide pattern 22 is removed to expose the projecting portion.

Next, as shown in FIG. 11D, oxidation is performed to form a gate insulating film 23. Thereafter, a polysilicon film is deposited and doped with impurities to become a conductive type polysilicon film 24. Further, a titanium film 25 is deposited and thereafter subjected to coating with a resist 27 and etchback. Only a ridge portion 26 of the projecting portion is thus exposed, and the other region is covered with the resist 27. Then, as shown in FIG 11E, the titanium film 25 on the ridge portion 26 of the projecting portion is removed.

Next, as shown in FIG. 11F, after the removal of the resist 27, heat treatment is performed to cause a silicifying reaction, forming a titanium silicide film 28. In this case, a polysilicon film 29 on the ridge portion 26 of the projecting portion is not silicified and left as a polysilicon film. Next, as shown in FIG. 11G, processing is performed with hydrofluoric acid to remove the titanium silicide film 28, as a consequence of which only the polysilicon film 29 on the ridge portion 26 and the gate insulating film 23 are left, forming a gate electrode constructed of a quantum thin line 29. In this case, the top portion facing the gate electrode 29 on the ridge portion 26 is used as a channel region.

However, the conventional quantum thin line forming methods disclosed in the aforementioned reference documents (1) through (3) have the following problems. That is, the reference (1) is the method effective only when the substrate is made of SOI and is not applicable to the conventionally used Si substrate. The SOI substrate costs ten to twenty times the price of the Si substrate, and it is preferable to form the quantum thin line with the Si substrate in order to further reduce the cost.

According to the aforementioned reference (2), the cost can be suppressed low since the Si substrate can be used. However, for the reason that the Si thin line 15 is formed at the top of the Si substrate 11 having a triangular cross-section shape, the surface unevenness of the Si substrate 11 increases. Therefore, the flatness of the surface of the Si substrate 11 becomes degraded, and this results in a difficulty in forming a single-electron transistor.

According to the aforementioned reference (3), for the reason that the Si thin line 29 is formed at the top of the Si substrate 21 having a triangular cross-section shape similarly to the aforementioned reference (2), the surface unevenness of the Si substrate 21 increases. Therefore, the flatness of the surface of the Si substrate 21 becomes degraded, and this results in a difficulty in forming a single-electron transistor. There is a further problem that, since the channel region existing in the ridge portion 26 of the projecting portion is connected with the Si substrate 21, the region cannot be a complete electron confining region.

SUMMARY OF THE INVENTION

Accordingly, the object of the present invention is to provide a quantum thin line producing method capable of easily forming a single electron device or a quantum effect device with good surface flatness of the semiconductor substrate after forming the quantum thin line on a semiconductor substrate made of Si, GaAs or the like and of forming a complete electron confining region as well as to provide a semiconductor device employing the quantum thin line.

In order to achieve the aforementioned object, the present invention provides a quantum thin line producing method comprising: a process for depositing a first insulating film on a semiconductor substrate surface, performing resist patterning and subjecting the first insulating film to isotropic etching, consequently forming an etching mask; a process for subjecting the semiconductor substrate to anisotropic etching using the etching mask, consequently forming a semiconductor protruding portion on the surface of the semiconductor substrate; a process for removing the etching mask, filling up the semiconductor protruding portion by depositing a second insulating film on the semiconductor substrate and flattening the surface of the second insulating film; a process for forming a resist pattern for covering a region other than a region which belongs to the semiconductor substrate surface and in which a quantum thin line is to be formed, subjecting the second insulating film to anisotropic etching using the resist pattern as a mask and exposing a top portion of the semiconductor protruding portion on the surface of the second insulating film, consequently forming a semiconductor exposed portion; a process for removing the resist pattern and thereafter epitaxially growing a quantum thin line in the semiconductor exposed portion; and a process for isolating the quantum thin line from the semiconductor substrate in an insulating manner by oxidizing a lower portion of the quantum thin line.

According to the above construction, the semiconductor protruding portion where the quantum thin line is to be subsequently grown is formed on the semiconductor substrate surface by means of the general film forming technique, lithographic technique and etching technique. The positional control of the quantum thin line is thus performed. After the formation of the semiconductor protruding portion, the second insulating film is deposited on the semiconductor substrate surface to fill up the semiconductor protruding portion. The flatness of the semiconductor substrate surface is thus improved so that the subsequent formation of a single electron device or a quantum effect device employing the quantum thin line can be easily performed. The lower portion of the quantum thin line is oxidized to isolate the quantum thin line from the semiconductor substrate in an insulating manner. A complete electron confining region is thus formed.

Furthermore, the quantum thin line is made to epitaxially grow in the semiconductor exposed portion formed by subjecting the second insulating film to anisotropic etching. A quantum thin line having excellent crystallinity and good uniformity of size is thus formed with good reproducibility. As described above, according to the above construction, there is provided a quantum thin line producing method of a high yield and high productivity appropriate for mass production at reduced producing cost without using any special fine processing technique.

According to the present invention, there is provided a quantum thin line producing method comprising: a process for depositing a first insulating film on a semiconductor substrate surface, performing resist patterning and subjecting the first insulating film to anisotropic etching, consequently forming an etching mask; a process for subjecting the semiconductor substrate to crystal plane anisotropic etching using the etching mask, consequently forming a semiconductor projecting portion having an acute-angle tip on a surface of the semiconductor substrate; a process for removing the etching mask, filling up the semiconductor projecting portion by depositing a second insulating film on the semiconductor substrate and flattening the surface of the second insulating film; a process for forming a resist pattern for covering a region other than a region which belongs to the semiconductor substrate surface and in which a quantum thin line is to be formed, subjecting the second insulating film to anisotropic etching using the resist pattern as a mask and exposing a top portion of the semiconductor projecting portion on the surface of the second insulating film, consequently forming a semiconductor exposed portion; a process for removing the resist pattern and thereafter epitaxially growing a quantum thin line in the semiconductor exposed portion; and a process for isolating the quantum thin line from the semiconductor substrate in an insulating manner by oxidizing a lower portion of the quantum thin line.

According to the above construction, the semiconductor substrate is subjected to crystal plane anisotropic etching taking advantage of a difference in etching rate depending on the difference in Miller indices of the crystal of the potassium hydroxide aqueous solution or the like, as a consequence of which a semiconductor projecting portion is formed on the surface of the semiconductor substrate. The protruding portion is thus relatively easily formed on the semiconductor substrate surface, performing positional control of the quantum thin line. After the formation of the semiconductor projecting portion, the second insulating film is deposited on the semiconductor substrate surface, consequently filling up the semiconductor projecting portion. The flatness of the semiconductor substrate surface is thus improved so that the formation of a single electron device or a quantum effect device employing the quantum thin line can be easily performed. The lower portion of the quantum thin line is oxidized to isolate the quantum thin line from the semiconductor substrate in an insulating manner. A complete electron confining region is thus formed.

Furthermore, the quantum thin line is epitaxially grown on the semiconductor exposed portion formed by subjecting the second insulating film to anisotropic etching. A quantum thin line having excellent crystallinity and good uniformity of size is formed with good reproducibility. As described above, according to the above construction, there is provided a quantum thin line producing method of a high yield and high productivity appropriate for mass production at reduced producing cost without using any special fine processing technique.

In one embodiment, the process for epitaxially growing the quantum thin line comprises the steps of: introducing the semiconductor substrate on which the semiconductor exposed portion is formed into a reaction chamber and discharging air inside the reaction chamber so that the reaction chamber comes to have a high vacuum of not higher than $10^{-6}$ Torr; and thereafter flowing a material gas into the reaction chamber so as to perform vapor growth of the quantum thin line under a material gas partial pressure of not higher than $10^{-2}$ Torr.

According to the above embodiment, the atmospheric components and the impurities of moisture component and the like are discharged so that the reaction chamber comes to have a high vacuum of not higher than $10^{-6}$ Torr, consequently promoting the epitaxial growth in the highly clean environment. Then, during the epitaxial growth, the material gas partial pressure is controlled under a pressure of not higher than $10^{-2}$ Torr, and this prevents the rapid start of film growth on the entire surface of the insulating thin film and allows the selective vapor growth of the quantum thin line only in the semiconductor exposed portion. Thus, the degree of vacuum inside the reaction chamber, the amount of material gas to be introduced, the time of introduction, the substrate temperature and so on are controlled by means of a general high-vacuum CVD apparatus, by which the quantum thin line of the desired size is formed with high reproducibility.

In one embodiment, a silicon thin line is formed as the quantum thin line using any one of monosilane ($SiH_4$), disilane ($Si_2H_6$), trisilane ($Si_3H_8$), dichlorosilane ($SiH_2Cl_2$) and tetrachlorosilane ($SiCl_4$) as a material gas.

According to the above embodiment, a quantum thin line made of silicon is formed by using any one of $SiH_4$, $Si_2H_6$, $Si_3H_8$, $SiH_2Cl_2$ and $SiCl_4$ as the reaction gas, by which the uniformity of size and the reproducibility of the quantum thin line are further improved.

In one embodiment, a germanium thin line is formed as the quantum thin line using any one of monogermane ($GeH_4$), digermane ($Ge_2H_6$) and germanium tetrafluoride ($GeF_4$) as a material gas.

According to the above embodiment, a quantum thin line made of germanium is formed by using any one of $GeH_4$, $Ge_2H_6$ and $GeF_4$ as the reaction gas, by which the uniformity of size and the reproducibility of the quantum thin line are further improved.

In one embodiment, a silicon germanium thin line is formed as the quantum thin line using a mixed gas comprised of any one of monosilane ($SiH_4$), disilane ($Si_2H_6$), trisilane ($Si_3H_8$), dichlorosilane ($SiH_2Cl_2$) and tetrachlorosilane ($SiCl_4$) and any one of monogermane ($GeH_4$), digermane ($Ge_2H_6$) and germanium tetrafluoride ($GeF_4$) as a material gas.

According to the above embodiment, a quantum thin line made of silicon germanium is formed by using a mixed gas comprised of any one of $SiH_4$, $Si_2H_6$, $Si_3H_8$, $SiH_2Cl_2$ and $SiCl_4$ and any one of $GeH_4$, $Ge_2H_6$ and $GeF_4$ as the reaction gas, by which the uniformity of size and the reproducibility of the quantum thin line are further improved.

In one embodiment, an aluminum thin line is formed as the quantum thin line using an organic aluminum.

According to the above embodiment, a quantum thin line made of aluminum is formed by using an organic aluminum of dimethyl aluminum hydride (DMAH: $(CH_3)_2AlH$) or the like as a material, by which the uniformity of size and the reproducibility of the thin line are further improved.

According to the present invention, there is provided a semiconductor device having a source region, a drain region, a channel region located between the source region and the drain region, a gate region for controlling a channel current flowing through the channel region, a floating gate region located between the gate region and the channel region, a first insulating film located between the floating gate region and the gate region and a second insulating film located between the channel region and the floating gate region, the floating gate region being comprised of a quantum thin line formed by the quantum thin line producing method of the present invention.

According to the above construction, the quantum thin line is used as the floating gate region of the transistor, by which the electric charge accumulation is reduced and the amount of electric charges to be injected into the floating gate region is reduced. This enables the obtainment of a non-volatile memory of a small consumption of power, a high density and a large capacity.

According to the present invention, there is provided a semiconductor device having a source region, a drain region, a channel region located between the source region and the drain region, a gate region for controlling a channel current flowing through the channel region and a gate insulating film located between the channel region and the gate region, the channel region being comprised of a quantum thin line formed by the quantum thin line producing method of the present invention.

According to the above construction, the channel region of the transistor is constructed of the quantum thin line, by which the channel region is quantized in the direction perpendicular to the lengthwise direction, exhibiting linear conduction. As a result, a super-high-speed operation is enabled, allowing a transistor of a high yield and high productivity appropriate for mass production to be obtained at low cost.

In one embodiment, a semiconductor device comprising: a quantum thin line formed by the quantum thin line producing method of the present invention; a first insulating film and a second insulating film laminated with interposition of the quantum thin line; a first electrode formed on the first insulating film; and a second electrode formed on the second insulating film, whereby the quantum thin line emits light when a voltage is applied across the first electrode and the second electrode.

According to the above embodiment, by virtue of the quantum confining effect produced by putting the quantum thin line between the insulating film portions and further between the electrodes, the quantum thin line has a direct transition type band structure. Therefore, by making a tunnel current flow with a voltage applied across both the electrodes so as to inject electrons into the quantum thin line, electron transition occurs in the quantum thin line, causing light emission. Thus, a high-efficiency light-emitting device of excellent high-frequency characteristics having a sharp spectrum even with a small injection current can be obtained at low cost with a high yield and high productivity.

In one embodiment, a semiconductor device comprising: a quantum thin line formed by the quantum thin line producing method of the present invention; an n-type impurity region formed in a portion of the quantum thin line; and a p-type impurity region formed in contact with the n-type impurity region on the quantum thin line, whereby a junction region of both the impurity regions of the quantum thin line emits light when a voltage is applied across the n-type impurity region and the p-type impurity region.

According to the above embodiment, a pn junction is formed of the n-type impurity region and the p-type impurity region in the quantum thin line, where the direct transition type band structure is provided by the quantum confining effect. Therefore, by applying a voltage to the n-type impurity region and the p-type impurity region, reunion of an electron with a hole occurs in the pn junction portion, causing light emission. Thus, a high-efficiency light-emitting device of excellent high-frequency characteristics having a sharp spectrum even with a small injection current can be obtained at low cost with a high yield and high productivity.

In one embodiment, a semiconductor device having a quantum thin line formed by the quantum thin line producing method of the present invention, wherein a forbidden bandwidth of a first region of the quantum thin line is made smaller than a forbidden bandwidth of two second regions positioned on both sides of the first region, and the first region emits light when a voltage is applied across both the second regions.

According to the above embodiment, the quantum thin line has the direct transition type band structure by the quantum confining effect. Due to the fact that the forbidden bandwidth of the first region located in the center portion is smaller than the forbidden bandwidth of the second regions located on both sides, a double hetero structure in which the efficiency of reunion of an electron with a hole is high is provided. Therefore, by applying a voltage to the two second regions located on both sides of the first region, the reunion of an electron with a hole occurs in the second region, causing light emission. Thus, a high-efficiency light-emitting device or an optical transducing device of excellent high-frequency characteristics having a sharp spectrum even with a small injection current can be obtained at low cost with a high yield and high productivity.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 11A through 11G are process charts showing a Si thin line forming method utilizing conventional titanium silicification.

DETAILED DESCRIPTION OF THE PREFERRED EMBODIMENTS

Figure 1A:
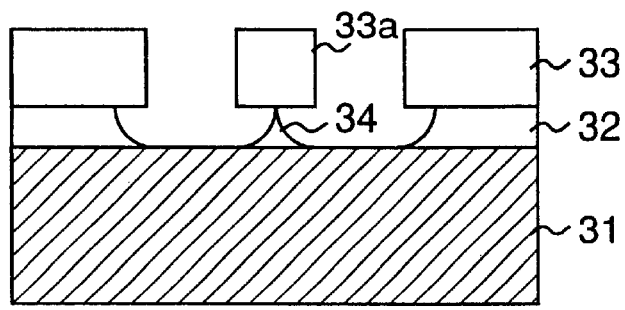
FIGS. 1A through 1E are sectional views of a substrate, showing a quantum thin line producing method according to the present invention.
Figure 1B:
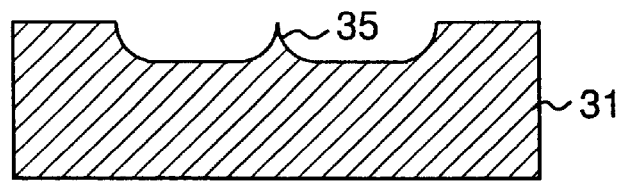

The present invention will be described in detail below on the basis of the embodiments thereof shown in the drawings.
<First Embodiment>

FIGS. 1A through 1E are sectional views of a substrate in the processing stages of the quantum thin line producing method of the present embodiment. Referring to FIGS. 1A through 1E, first, as shown in FIG. 1A, a first oxide film 32 is formed as a first insulating film having a film thickness of about 0.1 $\mu$m on a Si substrate 31 by oxidation, the CVD (chemical vapor deposition) method or the like. Subsequently, a resist pattern 33 is formed by photolithography. Then, isotropic etching is performed with hydrofluoric acid or the like using the resist pattern 33 as a mask, consequently forming a protrusion 34 on the first oxide film 32 below a resist pattern 33a.

Next, the resist pattern 33 is removed, and thereafter the silicon substrate 31 is etched by anisotropic etching of dry etching using the first oxide film 32 as a mask. In this case, the selection ratio of etching of the silicon substrate 31 relative to the first oxide film 32 is made about 1:1. By setting the selection ratio as described above, as shown in FIG. 1B, a Si protruding portion 35 is formed below the protrusion 34 on the surface of the Si substrate 31.

Figure 1C:
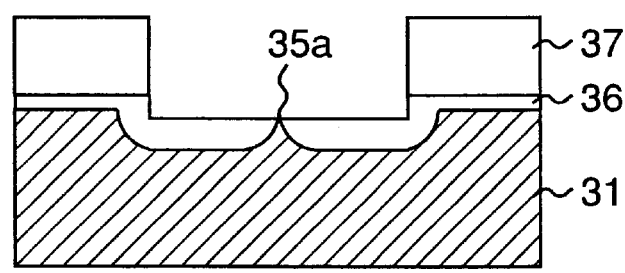
Figure 1D:
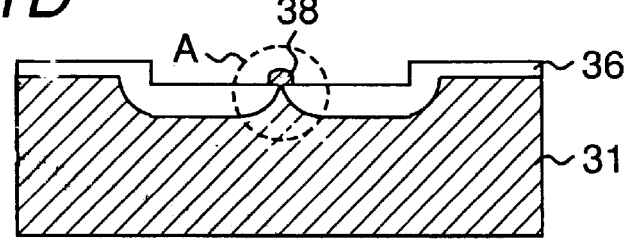

Next, as shown in FIG. 1C, a second oxide film 36 is formed as a second insulating film having a film thickness of about 1 $\mu$m so as to fill up a space between the Si protruding portions 35, and subsequently the surface is flattened by the CMP (chemical-mechanical polishing) method or the like. The film thickness of the second oxide film 36 on the flat surface of the silicon substrate 31 obtained through this CMP processing is required to be as thin as possible for the improvement of flatness and is set to, for example, 0.1 $\mu$m or less. Subsequently, a resist pattern 37 only the quantum thin line forming region of which is opened is formed, and the second oxide film 36 is subjected to anisotropic etching using this resist pattern 37 as a mask, consequently exposing the top 35a of the Si protruding portion 35.

Next, the entire substrate is placed in a reaction chamber equivalent to a high-vacuum CVD apparatus. Then, air inside the reaction chamber is discharged until a vacuum of about $10^{-8}$ Torr is attained. Thereafter, by supplying silane ($SiH_4$) gas or disilane ($Si_2H_6$) gas with the substrate temperature set to about 550° C. to 600° C. and performing control so that the partial pressure of the gas becomes $10^{-2}$ Torr or lower, a Si thin line 38 is made to epitaxially grow on the exposed portion (referred to as a Si exposed portion hereinafter) 35a of the Si substrate 31. In this case, it is required to subsequently isolate the Si thin line 38 from the Si substrate 31 through oxidation, and therefore, the Si thin line 38 is made to grow wider than the width of the Si exposed portion 35a. In this case, during the epitaxial growth process, the partial pressure of the material gas is set to $10^{-2}$ Torr or lower. This prevents the rapid start of film growth on the entire surface of the insulating thin film and causes the Si thin line 38 to grow selectively in vapor phase only on the Si exposed portion 35a.

In order to eliminate the damage due to the etching of the Si exposed portion 35a prior to the epitaxial growth of the Si thin line 38, it is acceptable to form a sacrifice oxide film on the surface of the Si exposed portion 35a and perform wet etching for an appropriate time. The evacuation of the reaction chamber is not limited to $10^{-8}$ Torr but permitted to be not higher than $10^{-6}$ Torr.

Figure 1E:
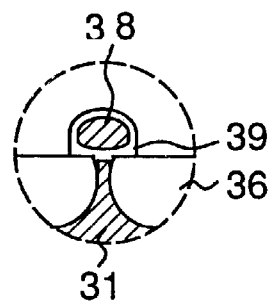

Finally, as shown in FIG. 1E (enlarged view of the portion A in FIG. 1D), oxidation is performed to form the lower portion of the Si thin line 38 into a third oxide film 39, so that the Si thin line 38 is isolated from the Si substrate 31 by the third oxide film 39, consequently forming the Si thin line 38.

As described above, in the present embodiment, after the formation of the Si protruding portion 35 on the Si substrate 31 by opportunely using the general film forming technique, photolithographic technique and etching technique, the second oxide film 36 is formed to fill up the space between the Si protruding portions 35, and the surface is flattened by the CMP method or the like. Thereafter, the second oxide film 36 in the quantum thin line forming region is subjected to anisotropic etching to expose the top 35a of the Si protruding portion 35. Then, the Si thin line 38 is made to epitaxially grow in the Si exposed portion 35a, and the Si thin line 38 is isolated from the Si substrate 31 by the third oxide film 39 formed through oxidation.

Therefore, according to the present embodiment, the Si thin line 38 can be formed not on any special substrate of SOI or the like but on the Si substrate 31 that has conventionally been used. Therefore, a quantum thin line can be formed at low cost. The space between the Si protruding portions 35 is filled up with the second oxide film 36 formed on the Si substrate 31 on the surface of which the Si protruding portion 35 has been formed, and the surface is flattened by CMP. Accordingly, the periphery of the Si thin line 38 can be flattened. Therefore, wiring and so on when subsequently forming a single electron device or a quantum effect device using the Si thin line 38 can be made easy. The quantum thin line 38 is isolated from the Si substrate 31 by the third oxide film 39. Therefore, the bottom surface side of the Si thin line 38 is not put in contact with the Si substrate 31, so that the electron can be completely confined.

Furthermore, the Si thin line 38 is made to epitaxially grow in the Si exposed portion 35a formed in the Si protruding portion 35 of the Si substrate 31, and therefore, a crystallinity equivalent to that of the Si substrate 31 can be obtained. The Si exposed portion 35a can be formed by the general film forming technique, lithographic technique and etching technique. Therefore, the Si thin line 38 can be formed without using any special fine processing technique. That is, according to the present embodiment, a method for producing a quantum thin line that enables the reduction of producing cost and has a high yield and high productivity appropriate for mass production can be provided.

<Second Embodiment>

Figure 2A:
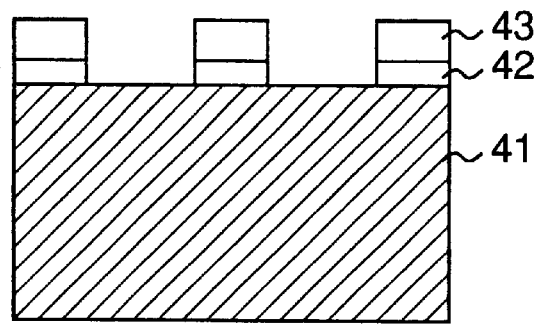
FIGS. 2A through 2E are sectional views of a substrate, showing a quantum thin line producing method different from that of FIGS. 1A–1E.

FIGS. 2A through 2E are sectional views of a substrate in each process of the quantum thin line producing method of the present embodiment. In FIGS. 2A through 2E, first, as shown in FIG. 2A, a first oxide film 42 is formed as the first insulating film having a film thickness of about 0.1 μm on a silicon substrate 41 by the oxidation method, CVD method or the like. Subsequently, a resist pattern 43 is formed by photolithography, and anisotropic etching is performed using this resist pattern 43 as a mask, patterning the first oxide film 42.

Figure 2B:
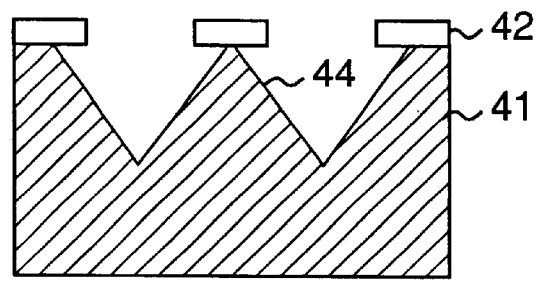

Next, as shown in FIG. 2B, the resist pattern 43 is removed and thereafter crystal plane anisotropic etching is performed using the first oxide film 42 as a mask. By etching the silicon substrate 41, a Si projecting portion 44 having a triangular cross-section shape is formed. The crystal plane anisotropic etching is the etching as follows. That is, if, for example, potassium hydroxide (KOH) aqueous solution is used as an etchant, then the etching progresses exposing the (111) plane since the etching rate of the (111) plane is much faster than the etching rate of the (100) plane. In regard to the above-mentioned etchant, the same effect can be obtained by the etchant of sodium hydroxide liquid, hydrazine liquid, a mixed liquid of ethylenediamine and bicatechol, copper-nitrate-added ammonium fluoride or the like besides the potassium hydroxide so long as the etchant can be used for anisotropic etching. Although an oxide film 42 is used as a mask material for etching the silicon substrate 41, any material, i.g. a silicon nitride film, can be used so long as the material can prevent the etching when etching the silicon.

Figure 2C:
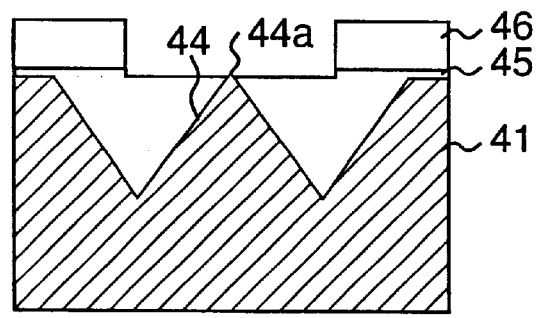
Figure 2D:
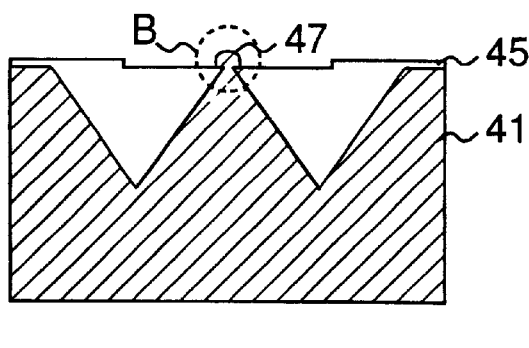

Next, as shown in FIG. 2C, the oxide film 42 is removed, and thereafter a second oxide film 45 is formed as the second insulating film having a film thickness of about 1 μm to fill up the space between the Si projecting portions 44, and the surface is flattened by the CMP method or the like. The film thickness of the second oxide film 45 on the flat surface of the silicon substrate 41 obtained through the CMP process is required to be made as thin as possible for the improvement in flatness. For example, the film thickness is set to 0.1 μm or less. Subsequently, a resist pattern 46 only the quantum thin line forming region of which is opened is formed, and the second oxide film 45 is subjected to anisotropic etching using this resist pattern 46 as a mask, exposing the top 44a of the Si projecting portion 44.

Next, the entire substrate is placed in a reaction chamber equivalent to the high-vacuum CVD apparatus. Then, air inside the reaction chamber is discharged until a vacuum of about $10^{-8}$ Torr is attained. Thereafter, by supplying silane ($SiH_4$) gas or disilane ($Si_2H_6$) gas with the substrate temperature set to about 550° C. to 600° C. and performing control so that the partial pressure of the gas will become $10^{-2}$ Torr or lower, a Si thin line 47 is made to epitaxially grow on the exposed portion (referred to as a Si exposed portion hereinafter) 44a of the Si substrate 41. In this case, it is required to subsequently isolate the Si thin line 47 from the Si substrate 41 through oxidation, and therefore, the Si thin line 47 is made to grow wider than the width of the Si exposed portion 44a. In this case, during the epitaxial growth process, the partial pressure of the material gas is set to $10^{-2}$ Torr or lower. This prevents the rapid start of film growth on the entire surface of the insulating thin film and causes the Si thin line 47 to grow selectively in vapor phase only on the Si exposed portion 44a.

In order to eliminate the damage due to the etching of the Si exposed portion 44a prior to the epitaxial growth of the Si thin line 47, it is acceptable to form a sacrifice oxide film on the surface of the Si exposed portion 44a and perform wet etching for an appropriate time. The evacuation of the reaction chamber is not limited to $10^{-8}$ Torr but permitted to be not higher than $10^{-6}$ Torr.

Figure 2E:
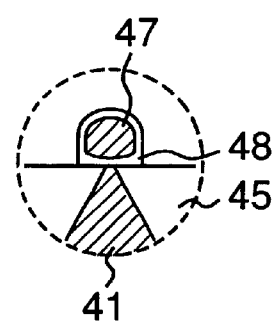

Finally, as shown in FIG. 2E (enlarged view of the portion B in FIG. 2D), oxidation is performed to form the lower portion of the Si thin line 47 into a third oxide film 48, so that the Si thin line 47 is isolated from the Si substrate 41 by the third oxide film 48, consequently forming the quantum thin line 47.

As described above, in the present embodiment, after the formation of the Si projecting portion 44 having a triangular cross-section of which the (111) plane is exposed on the surface of the Si substrate 41 by opportunely using the general film forming technique, photolithographic technique and etching technique, the second oxide film 45 is formed to fill up the space between the Si projecting portions 44, and the surface is flattened by the CMP method or the like. Thereafter, the second oxide film 45 in the quantum thin line forming region is subjected to anisotropic etching to expose the top of the Si projecting portion 44 and form the top into the Si exposed portion 44a. Then, the Si thin line 47 is made to epitaxially grow in the Si exposed portion 44a, and the Si thin line 47 is isolated from the Si substrate 41 by the third oxide film 48 formed through oxidation.

Therefore, according to the present embodiment, the Si thin line 47 can be formed not on any special substrate of SOI or the like but on the Si substrate 41 that has conventionally been used. Therefore, a quantum thin line can be formed at low cost. The space between the Si projecting portions 44 is filled up with the second oxide film 45 formed on the Si substrate 41 on the surface of which the Si projecting portion 44 has been formed, and the surface is flattened by CMP. Accordingly, the periphery of the Si thin line 47 can be flattened. Therefore, wiring and so on when forming a single electron device or a quantum effect device using the Si thin line 47 can be made easy. The Si thin line 47 is isolated from the Si substrate 41 by the third oxide film 48. Therefore, the bottom surface side of the quantum thin line 47 is not put in contact with the Si substrate 41, so that the electron can be completely confined.

Furthermore, the Si thin line 47 is made to epitaxially grow in the Si exposed portion 44a formed in the Si projecting portion 44 of the Si substrate 41, and therefore, a crystallinity equivalent to that of the Si substrate 41 can be obtained. The Si exposed portion 44a can be formed by the general film forming technique, lithographic technique and etching technique. Therefore, the quantum thin line 47 can be formed without using any special fine processing technique. That is, according to the present embodiment, a method for producing a quantum thin line that enables the reduction of producing cost and has a high yield and high productivity appropriate for mass production can be provided.

<Third Embodiment>

Figure 3A:
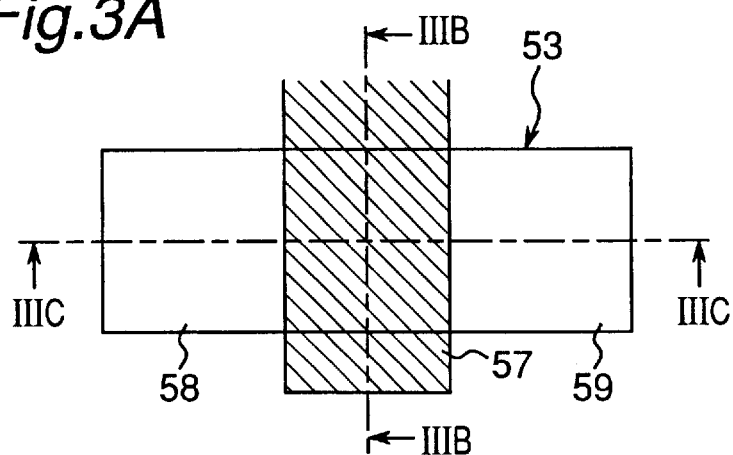
FIGS. 3A through 3C are views showing a non-volatile memory that serves as a semiconductor device of the present invention.
Figure 3B:
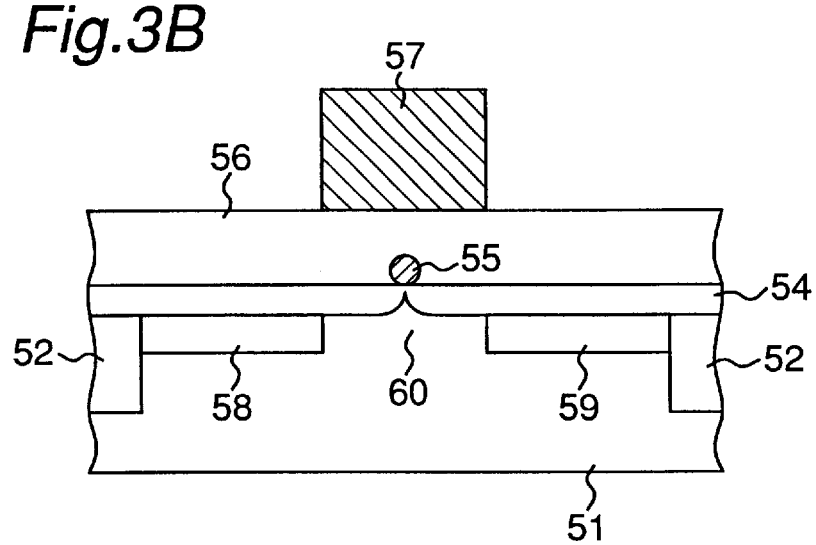

The present embodiment is related to a semiconductor device employing a quantum thin line formed by the first embodiment or the second embodiment. FIG. 3A is a plan view of a non-volatile memory (flash EEPROM (electrically erasable programmable read only memory) or the like) that serves as the above-mentioned semiconductor device. FIG. 3B is a sectional view taken along the line indicated by arrow IIIB—IIIB in FIG. 3A.

Figure 3C:
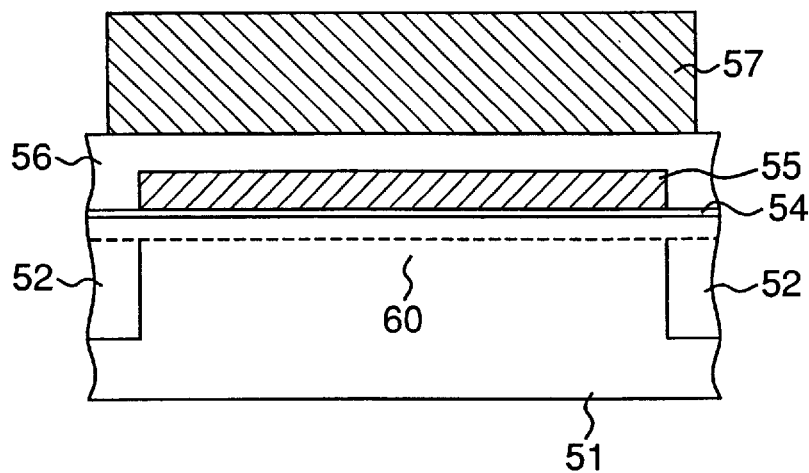

As shown in FIG. 3A and FIG. 3B, according to the present non-volatile memory, a rectangular region 53 surrounded by an element isolation region 52 is formed on a silicon substrate 51. Then, roughly at the center of the region 53, a nanometer-size quantum thin line 55 is formed in the direction roughly perpendicular to the lengthwise direction of the region 53 according to the first embodiment or the second embodiment (FIGS. 3A through 3C are relevant to the first embodiment). Then, the second and third oxide films (see FIG. 1E) formed on the silicon substrate 51 is made to serve as a tunnel oxide film 54, while the quantum thin line 55 is made to serve as a floating gate region. Subsequently, a control gate insulating film 56 having a film thickness of 10 nm is formed on the tunnel oxide film 54 and the quantum thin line 55 by the CVD method. Next, a gate electrode 57 is formed on the control gate insulating film 56, and thereafter a source region 58 and a drain region 59 are formed by implanting impurity ions using the gate electrode 57 as a mask. A channel region 60 is formed between the source region 58 and the drain region 59. A non-volatile memory is thus provided with a structure in which the floating gate region located between the channel region 60 and the gate electrode 57 is constructed of the quantum thin line 55.

FIG. 3C is a sectional view taken along the line indicated by arrow IIIC—IIIC in FIG. 3A. In the present embodiment, the quantum thin line 55 is arranged so as to roughly perpendicularly cross the source region 58 and the drain region 59 shown in FIG. 3A. Therefore, by using the quantum thin line 55 as the floating gate region, electric charge accumulation in the floating gate region can be reduced. Therefore, a non-volatile memory that has a very small consumption of power, a super-high density and a large capacity can be provided.

That is, according to the present embodiment, the Si quantum thin line 55 can be formed by the general film forming technique, lithographic technique and etching technique. Therefore, a non-volatile memory of a high yield and high productivity appropriate for mass production can be provided at low cost. It is to be noted that the quantum thin line 55 is not limited to silicon and is allowed to be another semiconductor material or another metal material.

<Fourth Embodiment>

Figure 4A:
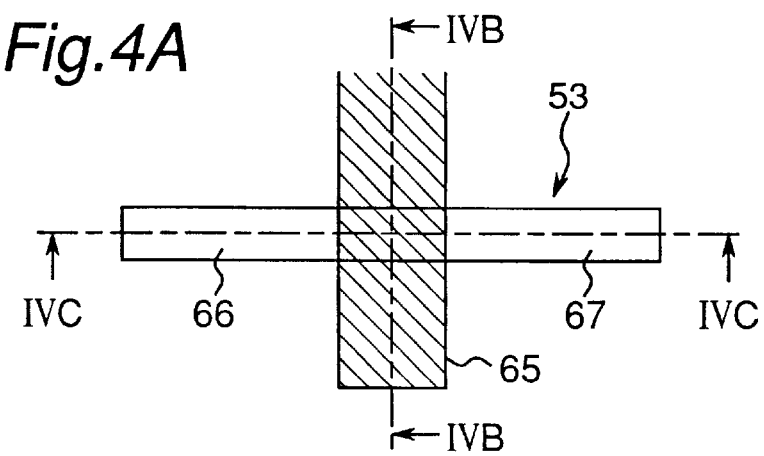
FIGS. 4A through 4C are views showing a MOSFET that serves as a semiconductor device different from that of FIGS. 3A–3C.
Figure 4B:
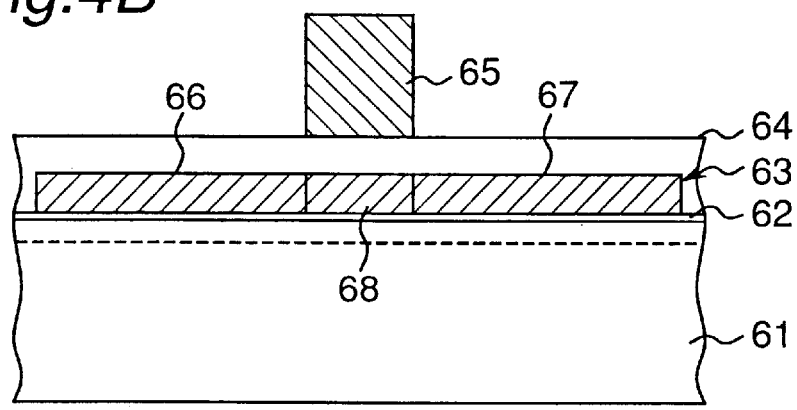
Figure 4C:
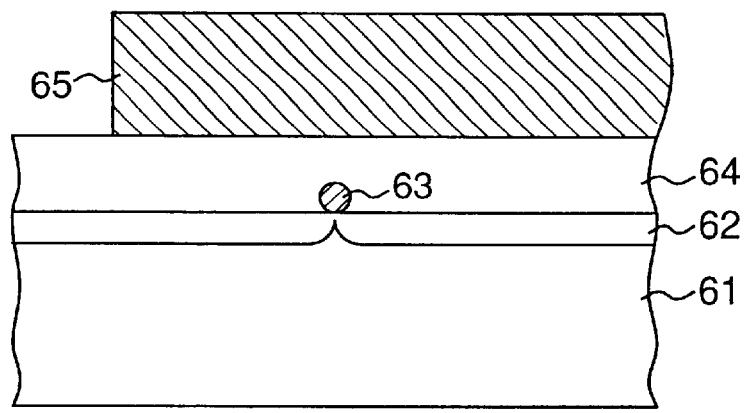

FIG. 4A is a plan view of a MOSFET that serves as the aforementioned semiconductor device. FIG. 4B is a sectional view taken along the line indicated by arrow IVB—IVB in FIG. 4A. FIG. 4C is a sectional view taken along the line indicated by arrow IVC—IVC in FIG. 4A.

As shown in FIGS. 4A through 4C, in the present MOSFET, an insulating layer (the aforementioned second and third oxide films) 62 and a quantum thin line 63 are formed on a silicon substrate 61 according to the first embodiment or the second embodiment (FIGS. 4A through 4C are relevant to the first embodiment). Subsequently, a gate insulating film 64 having a film thickness of 30 nm is formed on the insulating layer 62 and the quantum thin line 63 by the CVD method. Then, after the formation of a gate electrode 65 on the gate insulating film 64, impurity ions are implanted using the gate electrode 65 as a mask, forming a source region 66 and a drain region 67 in the quantum thin line 63. In this case, the space between the source region 66 and the drain region 67 in the quantum thin line 63 becomes a channel region 68.

In the above construction, the width of the quantum thin line 63 can be formed to a thickness of not greater than 10 nm by means of the general film forming technique, lithographic technique and etching technique. Therefore, the channel region 68 can be quantized in the widthwise direction of the quantum thin line 63, allowing linear conduction to be attained. That is, according to the present embodiment, a super-high-speed MOSFET of a high yield and high productivity appropriate for mass production can be provided at low cost.

<Fifth Embodiment>

Figure 5:
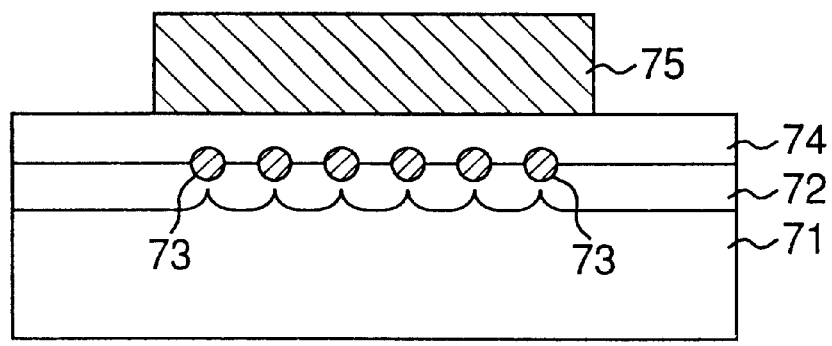
FIG. 5 is a view showing a light-emitting device that serves as a semiconductor device different from those of FIGS. 3A–3C and FIGS. 4A–4C.

FIG. 5 shows a cross section of the light-emitting device that serves as the aforementioned semiconductor device. In the light-emitting device shown in FIG. 5, an insulating layer (aforementioned second and third oxide films) 72 and a plurality of quantum thin lines 73 having a diameter of not greater than 10 nm are formed on a silicon substrate 71 according to the first embodiment or the second embodiment (FIG. 5 is relevant to the first embodiment). Then, a gate insulating film 74 having a film thickness of 30 nm is formed on the insulating layer 72 and the quantum thin lines 73 by the CVD method. Further, a transparent gate electrode 75 is formed of ITO (indium tin oxide) or the like on the gate insulating film 74.

In the above construction, each of the quantum thin lines 73 has a diameter of not greater than 10 nm, and therefore, a direct transition type band structure is provided by the quantum confining effect. Then, by applying a voltage across the gate electrode 75 and the silicon substrate 71, a tunnel current flows between the insulating film 72 and the gate insulating film 74. By the tunnel current, electrons are injected into the quantum thin lines 73, as a consequence of which electronic transition occurs in the quantum thin lines 73, causing light emission. That is, according to the present embodiment, a high-efficiency light-emitting device of excellent high-frequency characteristics having a sharp spectrum even with a small injection current can be obtained.

In the above case, the quantum thin lines 73 are formed of silicon by the general film forming technique, lithographic technique and etching technique. Therefore, a light-emitting device of a high yield and high productivity appropriate for mass production can be provided at low cost.

<Sixth Embodiment>

Figure 6A:
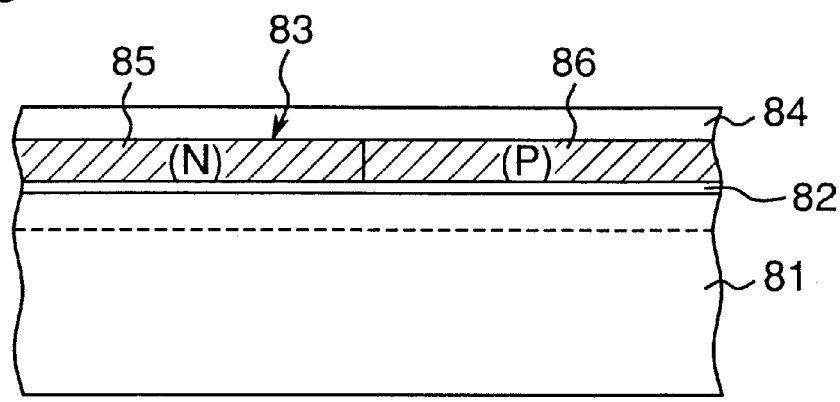
FIGS. 6A and 6B are views showing a light-emitting device that serves as a semiconductor device different from those of FIGS. 3A–3C through FIG. 5 and the band structure of the device.
Figure 6B:
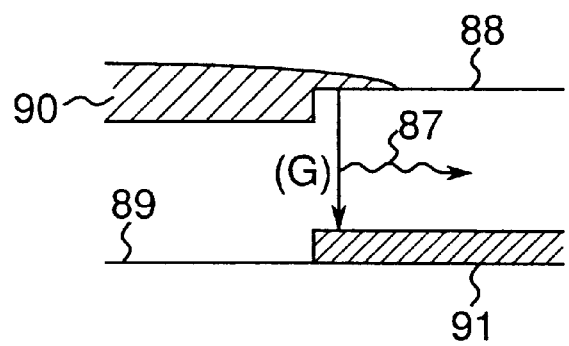

FIG. 6A shows the cross section of a light-emitting device that serves as the aforementioned semiconductor device. In the light-emitting device shown in FIG. 6A, an insulating layer (aforementioned second and third oxide films) 82 and a plurality of quantum thin lines 83 having a diameter of not greater than several tens of nanometers are formed on a silicon substrate 81 according to the first embodiment or the second embodiment (FIGS. 6A and 6B are relevant to the first embodiment). Then, an insulating film 84 having a film thickness of 30 nm is formed on the insulating layer 82 and the quantum thin lines 83 by the CVD method. Further, an n-type impurity region 85 is formed by implanting n-type impurity ions into part of the quantum thin line 83 by means of a photoresist mask (not shown). Likewise, a p-type impurity region 86 is formed by implanting p-type impurity ions into the region that belongs to the quantum thin lines 83 and is other than the n-type impurity region 85.

In the above construction, the diameter of the quantum thin line 83 is not greater than several tens of nanometers, and therefore, a direct transition type band structure is provided by the quantum confining effect. Then, a pn junction is formed in the boundary region located between the n-type impurity region 85 and the p-type impurity region 86. Therefore, a pn junction band structure as shown in FIG. 6B is formed. By applying a voltage across the n-type impurity region 85 and the p-type impurity region 86, reunion of an electron 90 with a hole 91 occurs in the pn junction region as indicated by arrow (G), consequently emitting light 87. It is to be noted that the reference numeral 88 denotes a conduction band and the reference numeral 89 denotes a valence band in FIG. 6B.

In the above case, the quantum thin line 83 is formed of silicon by means of the general film forming technique, lithographic technique and etching technique. Therefore, a light-emitting device of a high yield and high productivity appropriate for mass production can be provided at low cost.

<Seventh Embodiment>

Figure 7A:
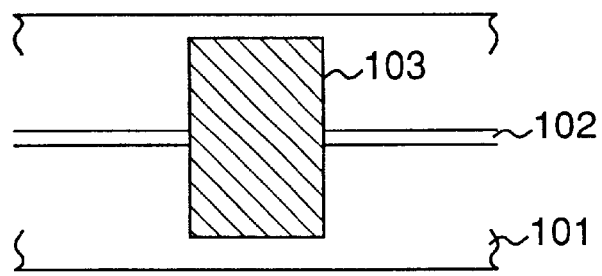
FIGS. 7A through 7E are views showing a procedure for forming a light-emitting device that serves as a semiconductor device different from those of FIGS. 3A–3C through FIGS. 6A and 6B.

FIGS. 7A through 7E are plan views showing a procedure for forming a light-emitting device that serves as the aforementioned semiconductor device. Referring to FIGS. 7A through 7E, first, as shown in FIG. 7A, a Si exposure portion 102 for exposing a Si substrate 101 from the second oxide film is formed as shown in FIG. 1C or FIG. 2C through the processes described in connection with the first embodiment or the second embodiment. In this case, the portion that belongs to the surface of the substrate 101 and is other than the Si exposure portion 102 is covered with an insulating layer (aforementioned second oxide film). Then, the Si exposure portion 102 is partially covered with the first nitride film 103.

Figure 7B:
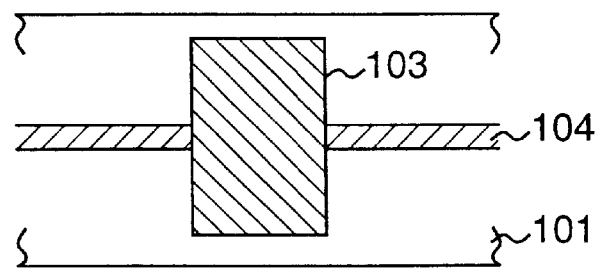
Figure 7C:
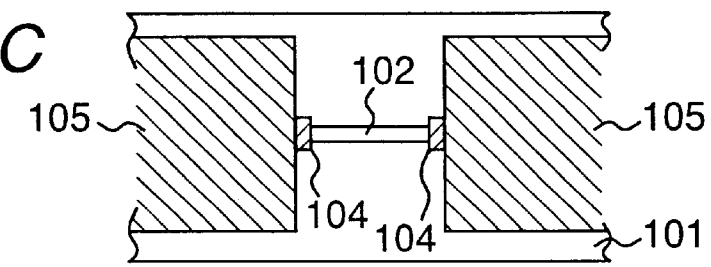

Next, as shown in FIG. 7B, a Si thin line 104 is made to grow in the portion that belongs to the Si exposure portion 102 and is not covered with the first nitride film 103 through the quantum thin line growth process described in connection with the first embodiment or the second embodiment. Next, as shown in FIG. 7C, the first nitride film 103 is removed to expose the portion that belongs to the Si exposure portion 102 and has been covered with the first nitride film 103, while a second nitride film 105 is formed so as to cover the portion of the Si thin line 104.

Figure 7D:
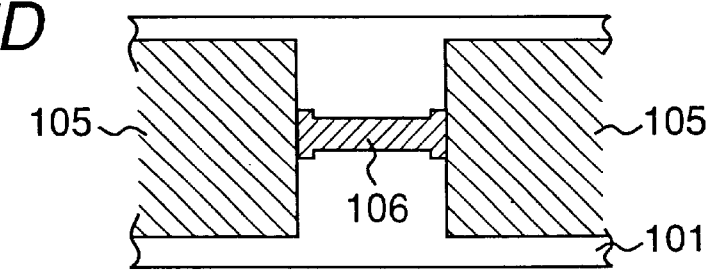
Figure 7E:
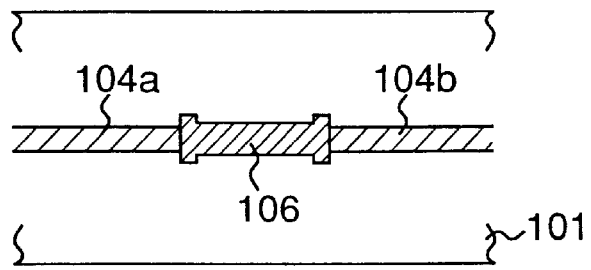

Next, as shown in FIG. 7D, a SiGe thin line 106 is made to grow in the portion that belongs to the Si exposure portion 102 and is not covered with the second nitride film 105 using monosilane (SiH$_4$) and monogermane (GeH$_4$) as material gases through the quantum thin line growth process described in connection with the first embodiment or the second embodiment. Next, as shown in FIG. 7E, the second nitride film 105 is removed, and thereafter appropriate ions are implanted into the SiGe thin line 106, a Si thin line 104a located on the left-hand side of the SiGe thin line 106 in the figure and a Si thin line 104b located on the right-hand side of the SiGe thin line 106 in the figure. The present light-emitting device is thus obtained.

Figure 8:
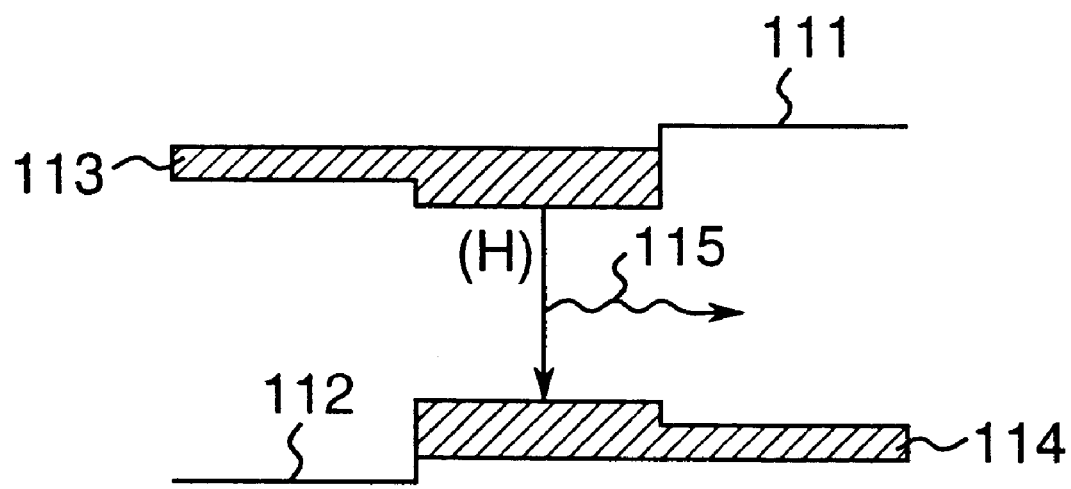
FIG. 8 is a view showing the band structure of the light-emitting device shown in FIGS. 7A–7E.
Figure 9A:
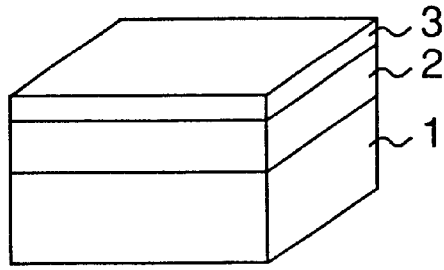
FIGS. 9A through 9E are process charts showing a Si thin line producing method using the conventional SOI substrate.
Figure 9B:
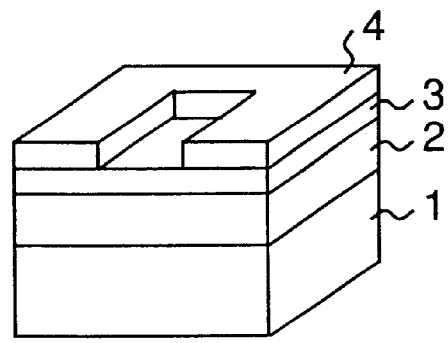
Figure 9C:
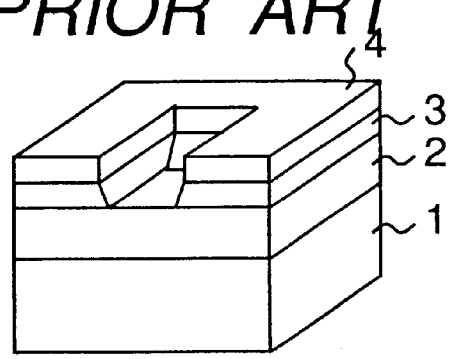
Figure 9D:
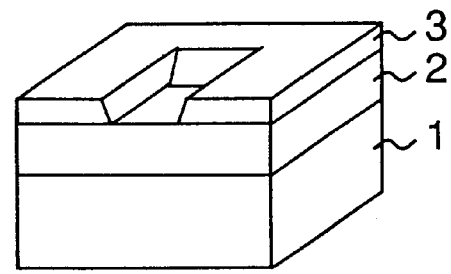
Figure 9E:
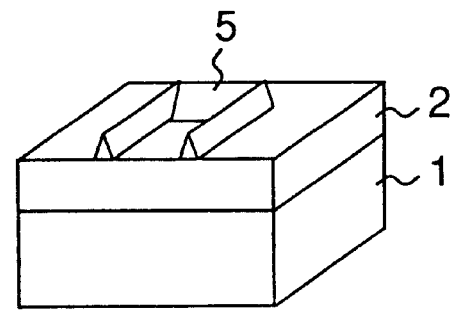
Figure 10A:
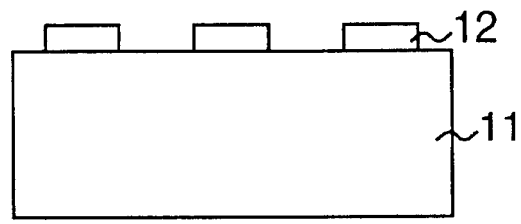
FIGS. 10A through 10F are process charts showing a Si thin line forming method utilizing conventional anisotropic etching.
Figure 10B:
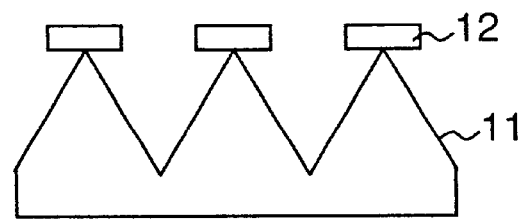
Figure 10C:
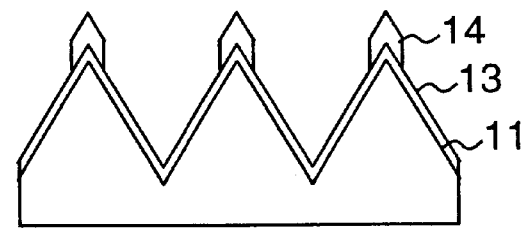
Figure 10D:
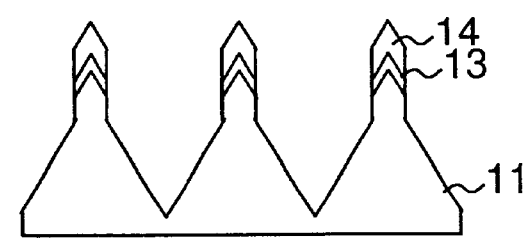
Figure 10E:
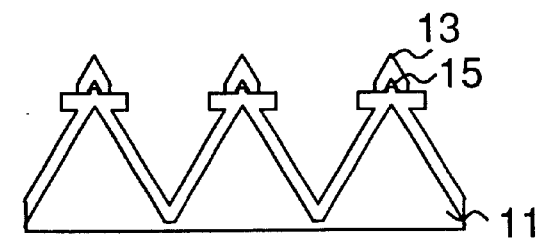
Figure 10F:
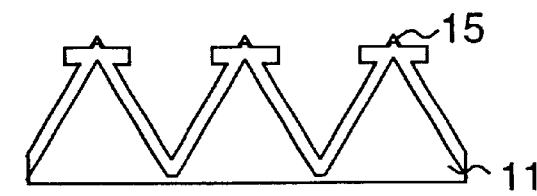

FIG. 8 shows the band structure of the light-emitting device having the aforementioned construction. The aforementioned SiGe, having a smaller band gap than that of Si, has a double hetero structure, in which an electron 113 and a hole 114 are concentrated on the SiGe thin line 106. Therefore, reunion of the electron 113 with the hole 114 indicated by arrow (H) is efficiently effected, consequently emitting light 115. It is to be noted that the reference numeral 111 denotes a conduction band and the reference numeral 112 denotes a valence band in FIG. 8.

In the above case, the Si thin line 104 and the SiGe quantum thin line 106 are formed of Si or SiGe by the general film forming technique, lithographic technique and etching technique. Therefore, a light-emitting device of a high yield and high productivity appropriate for mass production can be provided at low cost.

Although the Si substrate is employed as a semiconductor substrate in the first through seventh embodiments, the substrate is allowed to be made of a semiconductor material other than Si. Although disilane ($Si_2H_6$) is employed as a material gas in forming the quantum thin line of silicon, it is acceptable to use any one of monosilane ($SiH_4$) trisilane ($Si_3H_8$), dichlorosilane ($SiH_2Cl_2$) and tetrachlorosilane ($SiCl_4$). When the quantum thin line is formed of germanium, it is proper to use any one of monogermane ($GeH_4$), digermane ($Ge_2H_6$) and germanium tetrafluoride ($GeF_4$) as a material gas. When the quantum thin line is formed of silicon germanium, it is proper to use a mixed gas comprised of any one of monosilane ($SiH_4$), disilane ($Si_2H_6$), trisilane ($Si_3H_8$), dichlorosilane ($SiH_2Cl_2$) and tetrachlorosilane ($SiC_4$) and any one of monogermane ($GeH_4$), digermane ($Ge_2H_6$) and germanium tetrafluoride ($GeF_4$) as a material gas. When the quantum thin line is formed of aluminum, it is proper to use an organic aluminum of DMAH ($(CH_3)_2AlH$) or the like as a material.

Furthermore, the material of the quantum thin line is limited neither to the semiconductor of silicon, germanium or silicon germanium nor to the metal of aluminum. The present invention, capable of forming a superfine thin line of a conductive material without using any special fine processing apparatus, can also be applied to the wiring of a high-density LSI. The semiconductor device having a quantum thin line that becomes the basis of a quantum effect device and a single electron device and is produced according to the present invention can be mounted on the same substrate as that of a Si-based LSI. By applying this semiconductor device to a light-emitting device or a photoelectric transducing device, an electronic circuit and an optical communication circuit can be combined with each other.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A quantum thin line producing method comprising:
    a process for depositing a first insulating film on a semiconductor substrate surface, performing resist patterning and subjecting the first insulating film to isotropic etching, consequently forming an etching mask;
    a process for subjecting the semiconductor substrate to anisotropic etching using the etching mask, consequently forming a semiconductor protruding portion on the surface of the semiconductor substrate;
    a process for removing the etching mask, filling up the semiconductor protruding portion by depositing a second insulating film on the semiconductor substrate and flattening the surface of the second insulating film;
    a process for forming a resist pattern for covering a region other than a region which belongs to the semiconductor substrate surface and in which a quantum thin line is to be formed, subjecting the second insulating film to anisotropic etching using the resist pattern as a mask and exposing a top portion of the semiconductor protruding portion on the surface of the second insulating film, consequently forming a semiconductor exposed portion;
    a process for removing the resist pattern and thereafter epitaxially growing a quantum thin line in the semiconductor exposed portion; and
    a process for isolating the quantum thin line from the semiconductor substrate in an insulating manner by oxidizing a lower portion of the quantum thin line.

2. A quantum thin line producing method comprising:
    a process for depositing a first insulating film on a semiconductor substrate surface, performing resist patterning and subjecting the first insulating film to anisotropic etching, consequently forming an etching mask;
    a process for subjecting the semiconductor substrate to crystal plane anisotropic etching using the etching mask, consequently forming a semiconductor projecting portion having an acute-angle tip on a surface of the semiconductor substrate;
    a process for removing the etching mask, filling up the semiconductor projecting portion by depositing a second insulating film on the semiconductor substrate and flattening the surface of the second insulating film;
    a process for forming a resist pattern for covering a region other than a region which belongs to the semiconductor substrate surface and in which a quantum thin line is to be formed, subjecting the second insulating film to anisotropic etching using the resist pattern as a mask and exposing a top portion of the semiconductor projecting portion on the surface of the second insulating film, consequently forming a semiconductor exposed portion;
    a process for removing the resist pattern and thereafter epitaxially growing a quantum thin line in the semiconductor exposed portion; and
    a process for isolating the quantum thin line from the semiconductor substrate in an insulating manner by oxidizing a lower portion of the quantum thin line.

3. A quantum thin line producing method as claimed in claim 1, wherein
    the process for epitaxially growing the quantum thin line comprises the steps of:
    introducing the semiconductor substrate on which the semiconductor exposed portion is formed into a reaction chamber and discharging air inside the reaction chamber so that the reaction chamber comes to have a high vacuum of not higher than $10^{-6}$ Torr; and thereafter
    flowing a material gas into the reaction chamber so as to perform vapor growth of the quantum thin line under a material gas partial pressure of not higher than $10^{-2}$ Torr.

4. A quantum thin line producing method as claimed in claim 2, wherein
    the process for epitaxially growing the quantum thin line comprises the steps of:
    introducing the semiconductor substrate on which the semiconductor exposed portion is formed into a reaction chamber and discharging air inside the reaction chamber so that the reaction chamber comes to have a high vacuum of not higher than $10^{-6}$ Torr; and thereafter
    flowing a material gas into the reaction chamber so as to perform vapor growth of the quantum thin line under a material gas partial pressure of not higher than $10^{-2}$ Torr.

5. A quantum thin line producing method as claimed in claim 3, wherein
    a silicon thin line is formed as the quantum thin line using any one of monosilane ($SiH_4$), disilane ($Si_2H_6$), trisilane ($Si_3H_8$), dichlorosilane ($SiH_2Cl_2$) and tetrachlorosilane ($SiCl_4$) as a material gas.

6. A quantum thin line producing method as claimed in claim 4, wherein a silicon thin line is formed as the quantum thin line using any one of monosilane (SiH$_4$), disilane (Si$_2$H$_6$), trisilane (Si$_3$H$_8$), dichlorosilane (SiH$_2$Cl$_2$) and tetrachlorosilane (SiCl$_4$) as a material gas.

7. A quantum thin line producing method as claimed in claim 3, wherein
a germanium thin line is formed as the quantum thin line using any one of monogermane (GeH$_4$), digermane (Ge$_2$H$_6$) and germanium tetrafluoride (GeF$_4$) as a material gas.

8. A quantum thin line producing method as claimed in claim 4, wherein
a germanium thin line is formed as the quantum thin line using any one of monogermane (GeH$_4$), digermane (Ge$_2$H$_6$) and germanium tetrafluoride (GeF$_4$) as a material gas.

9. A quantum thin line producing method as claimed in claim 3, wherein
a silicon germanium thin line is formed as the quantum thin line using a mixed gas comprised of any one of monosilane (SiH$_4$), disilane (Si$_2$H$_6$), trisilane (Si$_3$H$_8$), dichlorosilane (SiH$_2$Cl$_2$) and tetrachlorosilane (SiCl$_4$) and any one of monogermane (GeH$_4$), digermane (Ge$_2$H$_6$) and germanium tetrafluoride (GeF$_4$) as a material gas.

10. A quantum thin line producing method as claimed in claim 4, wherein
a silicon germanium thin line is formed as the quantum thin line using a mixed gas comprised of any one of monosilane (SiH$_4$), disilane (Si$_2$H$_6$), trisilane (Si$_3$H), dichlorosilane (SiH$_2$Cl$_2$) and tetrachlorosilane (SiCl$_4$) and any one of monogermane (GeH$_4$), digermane (Ge$_2$H$_6$) and germanium tetrafluoride (GeF$_4$) as a material gas.

11. A quantum thin line producing method as claimed in claim 3, wherein
an aluminum thin line is formed as the quantum thin line using an organic aluminum.

12. A quantum thin line producing method as claimed in claim 4, wherein
an aluminum thin line is formed as the quantum thin line using an organic aluminum.

13. A semiconductor device having a source region, a drain region, a channel region located between the source region and the drain region, a gate region for controlling a channel current flowing through the channel region, a floating gate region located between the gate region and the channel region, a first insulating film located between the floating gate region and the gate region and a second insulating film located between the channel region and the floating gate region,
the floating gate region being comprised of a quantum thin line formed by the quantum thin line producing method claimed in claim 1.

14. A semiconductor device having a source region, a drain region, a channel region located between the source region and the drain region, a gate region for controlling a channel current flowing through the channel region, a floating gate region located between the gate region and the channel region, a first insulating film located between the floating gate region and the gate region and a second insulating film located between the channel region and the floating gate region,
the floating gate region being comprised of a quantum thin line formed by the quantum thin line producing method claimed in claim 2.

15. A semiconductor device having a source region, a drain region, a channel region located between the source region and the drain region, a gate region for controlling a channel current flowing through the channel region and a gate insulating film located between the channel region and the gate region,
the channel region being comprised of a quantum thin line formed by the quantum thin line producing method claimed in claim 1.

16. A semiconductor device having a source region, a drain region, a channel region located between the source region and the drain region, a gate region for controlling a channel current flowing through the channel region and a gate insulating film located between the channel region and the gate region,
the channel region being comprised of a quantum thin line formed by the quantum thin line producing method claimed in claim 2.

17. A semiconductor device comprising:
a quantum thin line formed by the quantum thin line producing method claimed in claim 1;
a first insulating film and a second insulating film laminated with interposition of the quantum thin line;
a first electrode formed on the first insulating film; and
a second electrode formed on the second insulating film, whereby
the quantum thin line emits light when a voltage is applied across the first electrode and the second electrode.

18. A semiconductor device comprising:
a quantum thin line formed by the quantum thin line producing method claimed in claim 2;
a first insulating film and a second insulating film laminated with interposition of the quantum thin line;
a first electrode formed on the first insulating film; and
a second electrode formed on the second insulating film, whereby
the quantum thin line emits light when a voltage is applied across the first electrode and the second electrode.

19. A semiconductor device comprising:
a quantum thin line formed by the quantum thin line producing method claimed in claim 1;
an n-type impurity region formed in a portion of the quantum thin line; and
a p-type impurity region formed in contact with the n-type impurity region on the quantum thin line, whereby
a junction region of both the impurity regions of the quantum thin line emits light when a voltage is applied across the n-type impurity region and the p-type impurity region.

20. A semiconductor device having a quantum thin line formed by the quantum thin line producing method claimed in claim 1, wherein
a forbidden bandwidth of a first region of the quantum thin line is made smaller than a forbidden bandwidth of two second regions positioned on both sides of the first region, and the first region emits light when a voltage is applied across both the second regions.

* * * * *